United States Patent [19]

Benjaminson

[11] Patent Number: 4,782,309
[45] Date of Patent: Nov. 1, 1988

[54] BILATERAL FREQUENCY ADJUSTMENT OF CRYSTAL OSCILLATORS

[75] Inventor: Albert Benjaminson, Arlington, Va.

[73] Assignee: The United States of America as represented by the Secretary of the Army, Washington, D.C.

[21] Appl. No.: 66,808

[22] Filed: Jun. 26, 1987

[51] Int. Cl.$^4$ .......................... H03B 5/32; H03B 5/38
[52] U.S. Cl. .................................. 331/139; 331/158; 331/177 R; 331/177 V
[58] Field of Search ........ 331/116 R, 116 FE, 116 M, 331/138, 139, 158, 159, 177 R, 177 V

[56] References Cited

U.S. PATENT DOCUMENTS 3,588,690  6/1971  Griffin ............................ 331/139 X
4,358,742  11/1982  Ferriss ................................. 331/158
4,661,785  4/1987  Benjaminson ...................... 331/109

OTHER PUBLICATIONS

"The Bridge-Stabilized Oscillator" by L. A. Meacham from Proceedings of the Institute of Radio Engineers, vol. 26, No. 10, dtd Oct. 1938, pp. 1278-1294.

"Results of Continued Development of the Differential Crystal Oscillator" by Albert Benjaminson, pp. 171-175. 1985 IEEE.

"Balanced Feedback Oscillators" by Albert Benjaminson, pp. 327-333, 38th Annual Frequency Control Symposium-1984 IEEE.

Primary Examiner—Eugene R. LaRoche
Assistant Examiner—David Mis
Attorney, Agent, or Firm—Sheldon Kanars; John T. Rehberg

[57] ABSTRACT

A crystal oscillator in a bridge circuit coupled to a differential amplifier. Coordinated adjustment of one or two arms of the bridge permits pulling of the crystal's operating frequency both above and below its series resonant frequency.

8 Claims, 1 Drawing Sheet

BILATERAL FREQUENCY ADJUSTMENT OF CRYSTAL OSCILLATORS

The Government has rights in this invention pursuant to Contract No. DAAL01-85-C-0445 awarded by the Department of the Army.

BACKGROUND OF THE INVENTION

1. Field of the Invention

This invention relates generally to oscillators and more particularly to bridge crystal oscillators.

2. Background of the Invention

Many oscillator designs have been suggested in which a high Q, series resonant circuit, such as a piezoelectric crystal is used to produce frequency stability. Such oscillators are used as reference frequency generators in many applications. The Pierce and Colpitts oscillators may employ a piezoelectric crystal to insure frequency stability. Another example of an oscillator which may utilize a piezoelectric crystal is a bridge oscillator. The bridge oscillator was first discussed in "The Bridge-Stabilized Oscillator," L. A. Meacham Proc. IRE Vol. 26 No. 10, pp. 1278-1294 October 1938. More recently, bridge oscillators have been discussed in U.S. Pat. No. 4,358,742, entitled "Transimpedance Oscillator Having High Gain Amplifier" issued to L. S. Ferris, Nov. 9, 1982 and in U.S. Pat. No. 4,661,785, entitled "Balanced Feedback Oscillators" issued to the present inventor, Apr. 28, 1987.

In a conventional Pierce or Colpitts oscillator, the Q of the crystal is degraded by circuit loading. The resulting loaded Q of the circuit may be only 70% of the intrinsic or unloaded Q of the crystal. This degradation in Q increases the bandwidth of the oscillator and adversely affects stability. However, the Meacham bridge oscillator has a loaded Q which is greater than the crystal's intrinsic Q.

The operating frequency of crystal oscillators is generally limited to the narrow region above the crystal's series resonant frequency but below the crystal's antiresonant frequency. This limited frequency range demands that crystal manufacturers supply crystals with a very tight tolerance on operating frequency.

Those concerned with oscillator development continuously search for new designs which increase the available range of frequency of oscillation.

SUMMARY OF THE INVENTION

Accordingly, it is an object of the present invention to provide an improvement in crystal oscillators.

It is a further object of the present invention to provide an improvement in the adjustability of the frequency range of a bridge stabilized oscillator.

And it is yet another object of the present invention to provide a crystal oscillator circuit capable of operation both above and below the crystal series resonant frequency.

An additional object of the present invention is to provide an adjustable crystal oscillator which exhibits a loaded Q greater than the crystal's intrinsic Q.

SUMMARY

Briefly, the foregoing and other objects are achieved in a bridge circuit which is coupled to a differential amplifier. The first two arms of the bridge circuit are capacitive. A third arm contains a piezoelectric crystal and a load capacitor, while the fourth arm contains a resistor and a capacitor. The non inverting input of the differential amplifier is connected between the two purely capacitive arms of the bridge. The inverting input of the differential amplifier is connected between the third and fourth arms of the bridge. Coordinated adjustment of the capacities in the third and fourth arms of the bridge provides adjustment of the resonant frequency of the oscillator throughout the region above and below the series resonant frequency.

BRIEF DESCRIPTION OF THE DRAWINGS

While the present invention is defined in the claims annexed to and forming a part of the specification, a better understanding can be had by reference to the following description when taken in conjunction with the accompanying drawings in which:

DETAILED DESCRIPTION OF THE DRAWINGS

Figure 1:
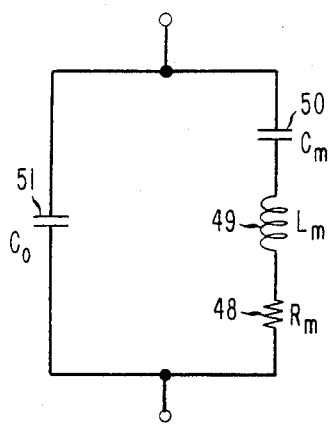
FIG. 1 is a circuit which models a conventional piezoelectric resonator.
Figure 2:
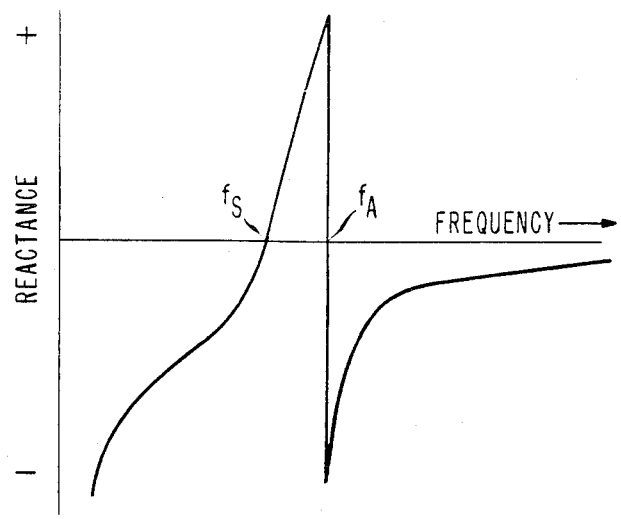
FIG. 2 is a graph illustrating the frequency dependence of the reactance of the circuit of FIG. 1.

Referring now to the drawings and more particularly to FIG. 1, shown thereat is a model of a piezoelectric quartz crystal unit. The mechanical resonance of the crystal is represented by the series combination of capacitance 50, inductance 49 and resistance 48, otherwise denoted by $L_m C_m R_m$. Because the crystal is a dielectric with electrodes, it also exhibits an electrical capacitance, $C_o$, denoted 51. The parallel combination of $C_o$ and the series combination $C_m L_m R_m$, (which is associated with mechanical motion of the plate) represents the equivalent circuit of the crystal. As illustrated in FIG. 2, the reactance of this equivalent circuit varies with frequency. The frequency at which the reactance is zero is termed the series resonant frequency, $f_s$.

Above the series resonant frequency, the crystal appears as a positive reactance (i.e., inductive). A parallel resonant frequency, $f_A$, (antiresonance) obtains when the impedance of the equivalent circuit of FIG. 1 is theoretically infinite, i.e., when the reactance of $C_o$ equals the net inductive reactance of the series combination of $L_m$ and $C_m$.

The Q values ($Q = 1/\omega R_m C_m$) of quartz crystal units are much higher than those attainable with other circuit elements. The Q of a typical crystal unit can be as high as $10^6$.

When crystal resonators are used in conventional parallel resonant oscillators (such as a Colpitts oscillator) the frequency of operation is limited to a narrow region above the series resonant frequency but below the antiresonant frequency. The crystal is thus used as an inductor in the oscillator's resonant circuit. The limited range between the series resonant frequency and anti-resonant frequency requires the crystal manufacturer to supply crystals with a very tight tolerance on operating frequency.

As mentioned before, in a traditional oscillator the Q of the crystal is degraded by circuit loading. This degradation in Q increases the bandwidth of the oscillator and adversely affects stability. However, Meacham, in the previously mentioned publication showed that in a bridge-type oscillator the loaded Q of the circuit is generally greater than the intrinsic Q of the crystal. The balancing action of the bridge tends to increase the effective Q of the series resonant circuit (crystal) by magnifying the phase shift produced as a result of any frequency deviation. Thus, the bridge oscillator promises greater stability than the conventional Pierce or Colpitts oscillator.

Figure 3:
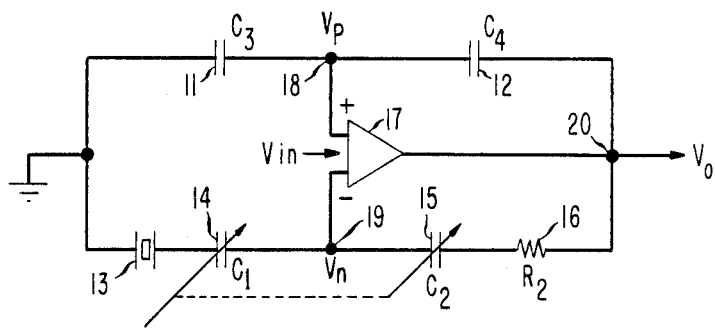
FIG. 3 is a circuit depicting the oscillator of the present invention.

The inventive device is depicted in FIG. 3. The bridge has four arms. Capacitors 11 and 12 form two arms of the bridge. Piezoelectric crystal 13 and load capacitor 14 form a third arm of the bridge, while capacitor 15 and resistor 16 form the fourth arm of the bridge. Crystal 13 may be any of the standard crystal cuts such as the AT cut or the Sc cut. The node 18 between capacitors 11 and 12 connected to the non-inverting input of a differential RF amplifier 17 such as a CA3001, CA3040 or MC1733. The node 19 between capacitors 14 and 15 is connected to the inverting input of amplifier 17. The output of amplifier 17 is connected to the node 20 between capacitor 12 and resistor 16.

Thus, there are two feedback loops through amplifier 17. The positive feedback loop goes through the non-inverting input of amplifier 17, while the negative feedback loop goes through the inverting input of amplifier 17. The negative feedback loop contributes to an increasing of the oscillator's Q above the intrinsic or unloaded Q of the crystal, as explained in the aforementioned U.S. Pat. No. 4,661,785, issued to the present inventor.

The necessary condition for oscillation can be described in terms used for analysis of feedback circuits where a positive feedback factor $\beta_p$ can be defined as $\beta_p = V_p/V_o$, and a negative factor $\beta_n$ as $\beta_n = V_n/V_o$, where $V_o$ is the voltage at node 20; $V_p$ is the voltage at node 18; and $V_n$ is the voltage at node 19. The circuit will oscillate when the gain, A, of the amplifier satisfies the equation:

$$A(\beta_p - \beta_n) \geq 1 \qquad (1)$$

It is necessary that the phase angles of the various impedances are such that $\beta_p$ and $\beta_n$ are both in phase with each other as well as with the amplifiers output voltage.

Thus, oscillation may be achieved by the use of pure resistor in three arms of the bridge. For example, if, in FIG. 3, elements 11, 12, 15 and 16 were eliminated and replaced by resistors, and capacitor 14 were also eliminated, leaving a bridge circuit with a crystal in one arm and resistors in the other three arms, the frequency of oscillation would be the series resonant frequency of the crystal. That is, the crystal would appear essentially as a pure resistance. The same frequency (i.e., the series resonant frequency) of oscillation can be achieved if elements 11 and 12 are not resistors so long as their phase angles match. Thus, the embodiment of FIG. 3 features capacitors 11 and 12.

Now, narrowing our view to the bridge arm comprised of crystal 13 and capacitor 14, it can be seen that the presence of load capacitor 14 in series with the crystal requires that crystal 13 behave inductively to maintain the in-phase condition. Consequently, the crystal resonates at a frequency somewhat higher than the series resonant frequency. The positive offset frequency, df, is given by:

$$df = f_{op} - f_s = f_{op}(C_m/2C_1) \qquad (2)$$

where $C_m$ is the motional capacitance of the crystal, shown in FIG. 1, and $C_1$ is the load capacitance shown in FIG. 3, $f_{op}$ is the new operating frequency, and $f_s$ is the series resonant frequency. An advantage of locating crystal 13 in the bridge position depicted in FIG. 3 (as opposed, for example, to placing the crystal in place of capacitor 12) is that one side of the crystal is grounded. The grounding reduces the capacities around a floating crystal connection to a single reduced capacity across the crystal to ground. This not only simplifies circuit analysis, but in applications where the crystal is used as a transducer for pressure, temperature, etc. it also simplifies the shielding arrangement.

Returning to FIG. 3, it also feasible to place a capacitor 15 in series with resistor 16. Presence of the capacitor 15 tends to require the crystal to assume a capacitive phase angle and produces a negative offset frequency given by:

$$df = f_s f_{op} = f_{op}(C_m R_m / 2R_2 C_2) \qquad (3)$$

where $R_m$ is the motional resistance of the crystal, defined with reference to FIG. 1, and the other variables are defined as before. Thus, the presence of capacitor 15 tends to pull the frequency of oscillation below the series resonant frequency of the crystal.

Thus, by judicious choice of both capacitors 14 and 15 (also denoted $C_1$ and $C_2$ in FIG. 3) the frequency of oscillation of the crystal may be pulled both above and below the series resonant frequency of the crystal.

Figure 4:
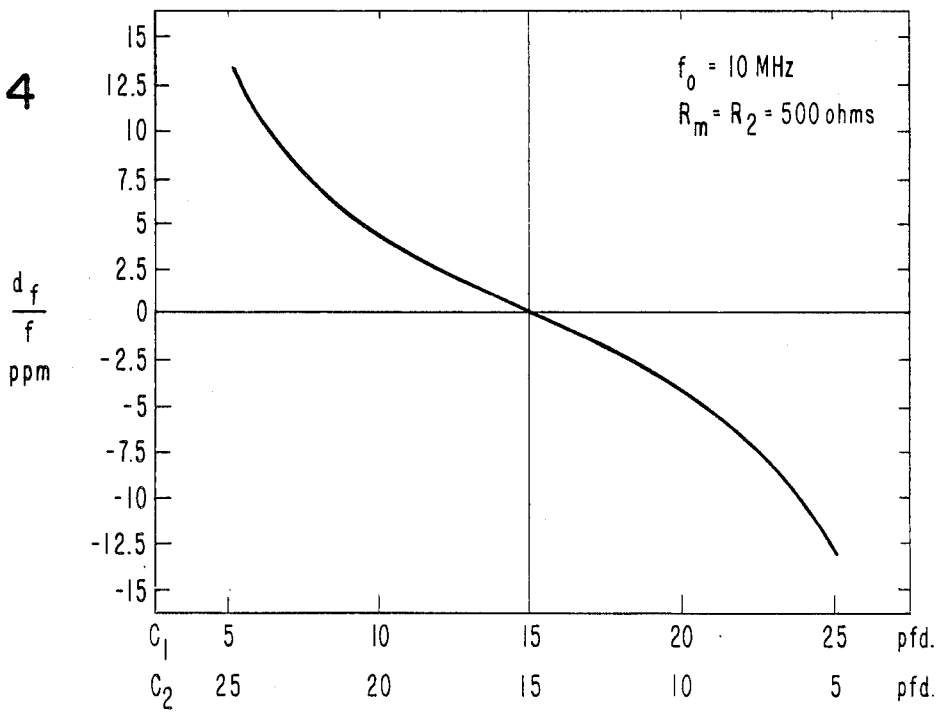
FIG. 4 is a graph illustrating the frequency shifting (or "pulling") achievable with the present invention.

FIG. 4 is a graph which illustrates the percentage frequency shift, df/f as a function of various values of $C_1$ and $C_2$ with resistor 16 ($R_2$ in FIG. 3) chosen to equal the motional resistance, $R_m$, at 500 ohms at a series resonant frequency of 10 MHz. It is assumed, in the graph of FIG. 4, that the electrode capacitance, $C_o$ in FIG. 1, is 1 pfd. Should $R_2$ be greater than $R_m$, which is often the case for designs for which $R_m$ is small, then with equal value capacitors, the negative excursion of the curve will be decreased in proportion with $R_m$ divided by $R_2$. This effect may be avoided by scaling $C_2$ down by the same ratio as $R_m$ divided by $R_2$.

Having shown and described what is at present considered to be the preferred method and embodiment of the invention, it should be noted that the foregoing detailed description has been made by way of illustration and not limitation. Accordingly, all modifications, changes and alterations coming within the spirit and scope of the invention are herein meant to be included.

What is claimed is:

1. An oscillator circuit comprising:
 a bridge circuit including a first pair of first and second connected arms, each having an impedance reactance means and a second pair of connected arms, the first arm of said second pair having a piezoelectric crystal connected in series with a capacitive reactance means, and the second arm of said second pair having a capacitive reactance means connected in series with a resistor;
 a differential amplifier having an inverting input and a non-inverting input, said non-inverting input being connected between said first pair of arms and said inverting input being connected between said second pair of arms, the output of said amplifier being connected between said second arm of said second pair and said second arm of said first pair.

2. The device of claim 1 wherein both said impedance means are capacitive.

3. The device of claim 1 wherein said capacitive reactance means of said first arm of said second pair of arms and said capacitive reactance means of said second arm of said second pair of arms are adjustably connected together.

4. The device of claim 1 wherein said piezoelectric crystal is an AT cut.

5. The device of claim 1 wherein said piezoelectric crystal is an SC cut.

6. The device of claim 1 wherein said amplifier is a CA3001.

7. The device of claim 1 wherein said amplifier is a CA3040.

8. The device of claim 1 wherein said amplifier is a MC733.

* * * * *